(12) United States Patent
Chang et al.

(10) Patent No.: US 9,395,618 B2
(45) Date of Patent: *Jul. 19, 2016

(54) ENHANCED EUV LITHOGRAPHY SYSTEM

(71) Applicant: TAIWAN SEMICONDUCTOR MANUFACTURING COMPANY, LTD., Hsin-Chu (TW)

(72) Inventors: Ching-Hsu Chang, Xinzhuang (TW); Nian-Fuh Cheng, Hsinchu (TW); Chih-Shiang Chou, Pingzhen (TW); Wen-Chun Huang, Tainan (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/807,999

(22) Filed: Jul. 24, 2015

(65) Prior Publication Data

US 2015/0331333 A1 Nov. 19, 2015

Related U.S. Application Data

(63) Continuation of application No. 13/437,145, filed on Apr. 2, 2012, now Pat. No. 9,091,930.

(51) Int. Cl.
*G03F 1/22* (2012.01)
*G03F 1/70* (2012.01)
*G03F 7/20* (2006.01)

(52) U.S. Cl.
CPC .. *G03F 1/22* (2013.01); *G03F 1/70* (2013.01); *G03F 7/70066* (2013.01); *G03F 7/70283* (2013.01); *G03F 7/70433* (2013.01)

(58) Field of Classification Search
CPC ......... G03F 1/22; G03F 1/70; G03F 7/70066; G03F 7/70433
USPC .................................... 430/5; 355/71; 716/55
See application file for complete search history.

(56) References Cited

U.S. PATENT DOCUMENTS

| 8,953,869 B2 | 2/2015 | Nasser-Ghodsi et al. |
| 9,091,930 B2 * | 7/2015 | Chang ........................ G03F 1/22 |

* cited by examiner

*Primary Examiner* — Christopher Young
(74) *Attorney, Agent, or Firm* — Haynes and Boone, LLP

(57) ABSTRACT

The present disclosure provides a semiconductor lithography system. The lithography system includes a projection optics component. The projection optics component includes a curved aperture. The lithography system includes a photo mask positioned over the projection optics component. The photo mask contains a plurality of elongate semiconductor patterns. The semiconductor patterns each point in a direction substantially perpendicular to the curved aperture of the projection optics component. The present disclosure also provides a method. The method includes receiving a design layout for a semiconductor device. The design layout contains a plurality of semiconductor patterns each oriented in a given direction. The method includes transforming the design layout into a mask layout. The semiconductor patterns in the mask layout are oriented in a plurality of different directions as a function of their respective location.

20 Claims, 5 Drawing Sheets

ENHANCED EUV LITHOGRAPHY SYSTEM

PRIORITY DATA

The present application is a continuation application of U.S. patent application Ser. No. 13/437,145, filed on Apr. 2, 2012, now U.S. Pat. No. 9,091,930 issued Jul. 28, 2015, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest apparatus that can be created using a fabrication process) has decreased.

To achieve the shrinking geometry sizes, advanced lithography processes have been developed. For example, the use of extreme ultraviolet (EUV) lithography has been proposed to achieve small geometry sizes. Due to heavy absorption of EUV radiation by substances, an EUV lithography system typically uses a reflective optics apparatus to carry out the lithography processes. However, conventional EUV lithography systems may suffer from a shadow effect, which may lead to device pattern uniformity issues or otherwise degrade lithography performance.

Therefore, while existing EUV lithography apparatuses and processes have been generally adequate for their intended purposes, they are not entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
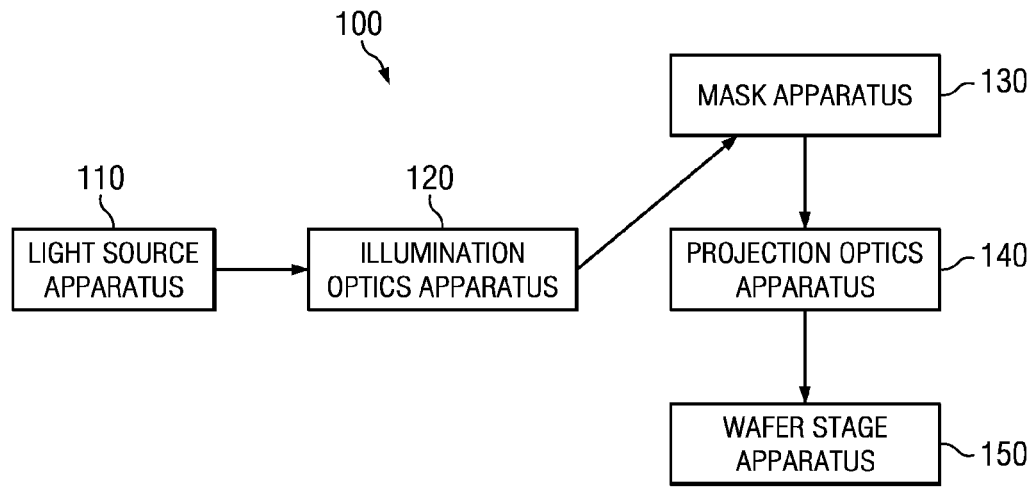
FIG. 1 is a simplified block diagram of an extreme ultraviolet (EUV) lithography system according to various aspects of the present disclosure.

It is understood that the following disclosure provides many different embodiments, or examples, for implementing different features of various embodiments. Specific examples of systems and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The use of extreme ultraviolet (EUV) lithography has been proposed to achieve increasingly small semiconductor device geometry sizes. An example EUV lithography system 100 is illustrated in FIG. 1. The EUV lithography system 100 includes a light source apparatus 110. The light source apparatus 110 is operable to generate radiation beams having a very small wavelength, for example a wavelength smaller than about 50 nanometers (nm), and even as small as about 10-15 nm in some cases. In certain embodiments, the light source apparatus 110 produces the small wavelength radiation beams in a laser-produced plasma (LPP) system, which uses a high power laser to create a high energy plasma that can emit the radiation beams having the small wavelengths. This can be done inside a vacuum chamber. In other embodiments, a discharge-produced plasma (DPP) method can be used to generate the radiation beams. Due at least in part to such small wavelengths, the EUV system 100 can achieve enhanced resolution for the semiconductor features to be patterned.

The EUV lithography system 100 includes illumination optics apparatus 120. The illumination optics apparatus 120 may include a collector optics apparatus to collect the radiation beams produced by the light source apparatus 110. The illumination optics apparatus 120 also includes a plurality of mirrors. These mirrors are operable to reflect the radiation a number of times. Since the radiation beams are highly absorbable due to the small wavelength, the material compositions of the mirrors are carefully configured to minimize radiation absorption. In some embodiments, to reduce absorption of the radiation beams, a plurality of alternating Molybdenum (Mo) and Silicon (Si) layers are used are a part of the mirrors. In some cases, specialized anti-absorption coating may also be applied to these mirrors to further reduce radiation absorption. And since gas such as air or nitrogen may also absorb the radiation beams, the entire illumination optics may be implemented inside a vacuum chamber in some embodiments. It is understood that additional contamination control measures may be implemented inside the illumination optics apparatus 120 to reduce the possibility of contamination.

The EUV lithography system 100 includes a mask apparatus 130. The mask apparatus 130 may include a multi-layered mask. The multi-layered mask may include a material having a low thermal expansion coefficient as an underlying substrate. A reflective multi-layer coating may be formed over substrate. The multi-layer coating may include a number of alternating material layers. The material layers may exhibit differing EUV reflectivity constants. For example, the multi-layer coating can include forty pairs of alternating Mo—Si layers. An absorber layer such as a TaN material layer may be disposed over the reflective multi-layer coating. A buffer layer such as a silicon dioxide layer may be disposed between the reflective multi-layer coating and the absorber layer to protect the multi-layer coating during the mask patterning process. A desired pattern for the EUV mask is defined by selectively removing portions of the absorber layer and the buffer layer to uncover portions of the underlying multi-layer coating on the substrate, thereby providing a patterned EUV mask. The absorber layer may be selectively removed by a combination of patterning (e.g., laser-beam and/or electron-beam writing) and etching (e.g., wet and/or dry etching) processes.

The EUV lithography system 100 includes a projection optics apparatus 140. The radiation beams are sent to the mask apparatus 130 from the illumination optics apparatus 120, and then propagated to the projection optics apparatus 140. The projection optics apparatus 140 may include one or more reflective mirrors, lenses, condensers, etc. The projection optics apparatus 140 may utilize ring field optics instruments. In the present embodiments, the projection optics apparatus 140 includes an aperture (or a slit) that is shaped like a portion of a ring, or an arc. In various embodiments, the mask apparatus 130 is positioned over the projection optics apparatus 140.

The EUV lithography system 100 includes a wafer stage apparatus 150. The wafer stage apparatus 150 is operable to hold a wafer that is to be patterned. The wafer stage apparatus 150 is positioned underneath the projection optics apparatus 140. In some embodiments, the wafer stage apparatus 150 includes an electronic chuck (E-chuck), which uses an electronic force to secure a wafer. In other embodiments, the wafer stage apparatus 150 includes a chuck that uses clamps to secure a wafer. The wafer stage apparatus 150 is movable to allow various regions of the wafer to be stepped and scanned.

Figure 2:
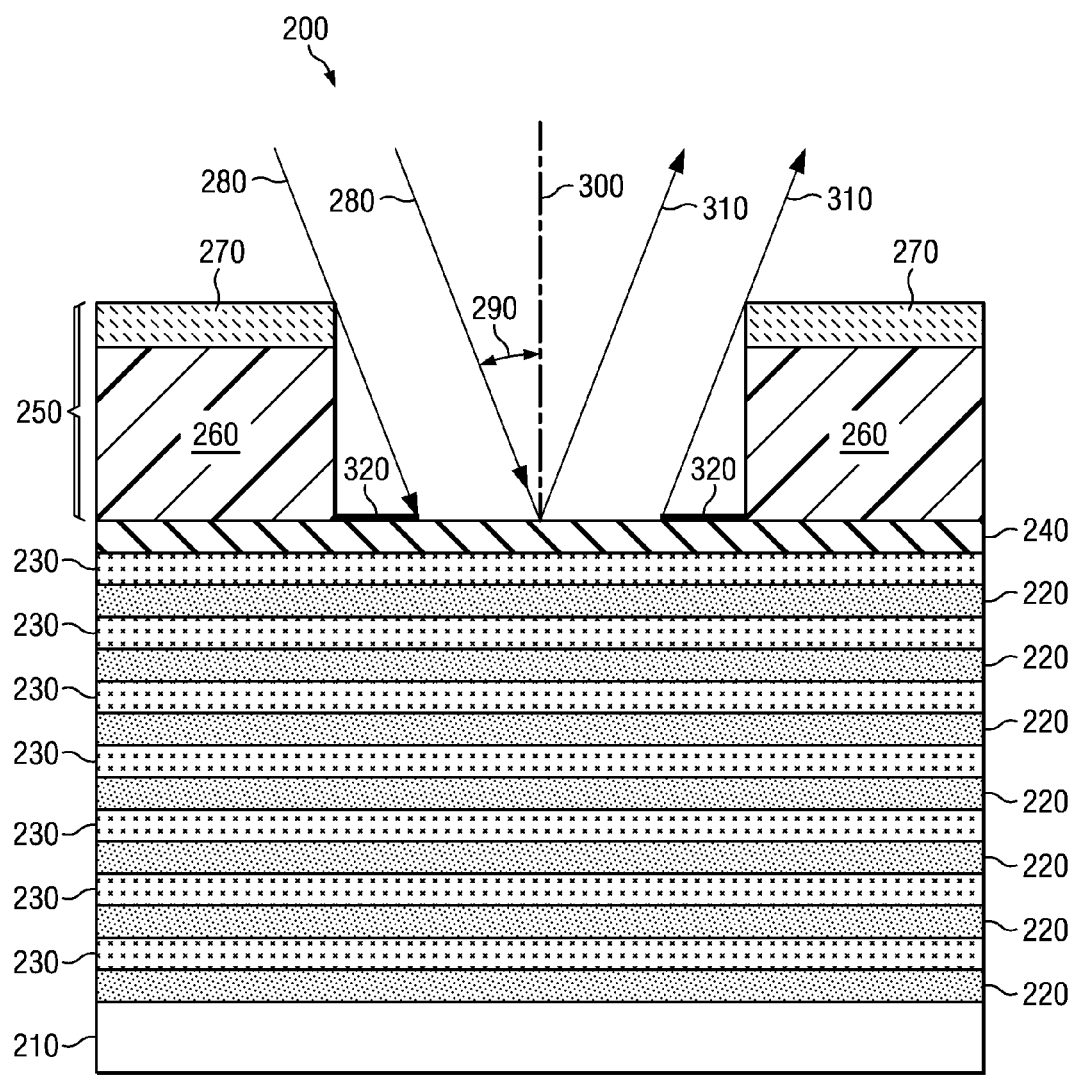
FIG. 2 is a simplified cross-sectional view of an EUV photo mask according to various aspects of the present disclosure.

Referring now to FIG. 2, a simplified diagrammatic fragmentary cross-sectional side view of an EUV lithography photo mask 200 is shown. The photo mask 200 may be implemented as an embodiment of the multi-layered mask for the mask apparatus 130 of FIG. 1. The photo mask 200 includes a silicon substrate 210. A plurality of silicon layers 220 and molybdenum layers 230 are located over the silicon substrate 210 in an alternating or interleaving manner. That is, a molybdenum layer 230 is located on a silicon layer 220, and another silicon layer 220 is located on the molybdenum layer 230, so on and so forth. A ruthenium (Ru) layer 240 is located on the alternating silicon-molybdenum layers.

The photo mask 200 also includes a plurality of layout patterns 250. These patterns 250 may represent semiconductor device features to be patterned on a semiconductor wafer, for example gate lines for Metal Oxide Semiconductor (MOS) transistors. In the illustrated embodiment, the patterns 250 each include a tantalum boron nitride (TaBN) component 260 and a lawrencium component 270. It is understood that the various materials and layers disclosed herein for the photo mask 200 are merely examples and are not intended to be limiting. Other materials and layer configurations may be employed for alternative photo masks 200. In addition, it is understood that the various layers are not drawn to scale in FIG. 2. For example, the alternating silicon and molybdenum layers 220-230 may have varying thicknesses.

A light 280 (for example, the EUV radiation beam generated by the light source apparatus 110) in an EUV lithography system is projected toward the photo mask 200 at a non-incident angle. That is, the light 280 is projected toward the photo mask 200 in a tilted manner and thus forms an incident angle 290 with a vertical axis 300 that is perpendicular to the surface of the photo mask 200. In some embodiments, the incident angle 290 is in a range from about 5 degrees to about 7 degrees. The reflected light 310 is then projected toward the projection optics (not shown in FIG. 2) to carry out the EUV lithography process. However, since the patterns 250 have a height, the tilted light 280 (or the reflected light 310) will cause shadows 320 to be present on the surface of the photo mask 200. This is referred to as a shadow effect or a shadow bias, which may degrade lithography performance and is therefore undesirable.

In the following paragraphs, methods and systems to substantially eliminate the shadow effect will be discussed. According to various aspects of the present disclosure, the layout patterns on an EUV photo mask will be rotated (or arranged) so that they are aligned according to their respective azimuthal angles. In more detail, refer now to FIGS. 3A-3B, where FIG. 3A is a simplified perspective view of an example pattern 250A on an EUV photo mask, and FIG. 3B is a simplified top view of a portion of an EUV photo mask 200A on which a plurality of patterns 250A are located.

Figure 3A:
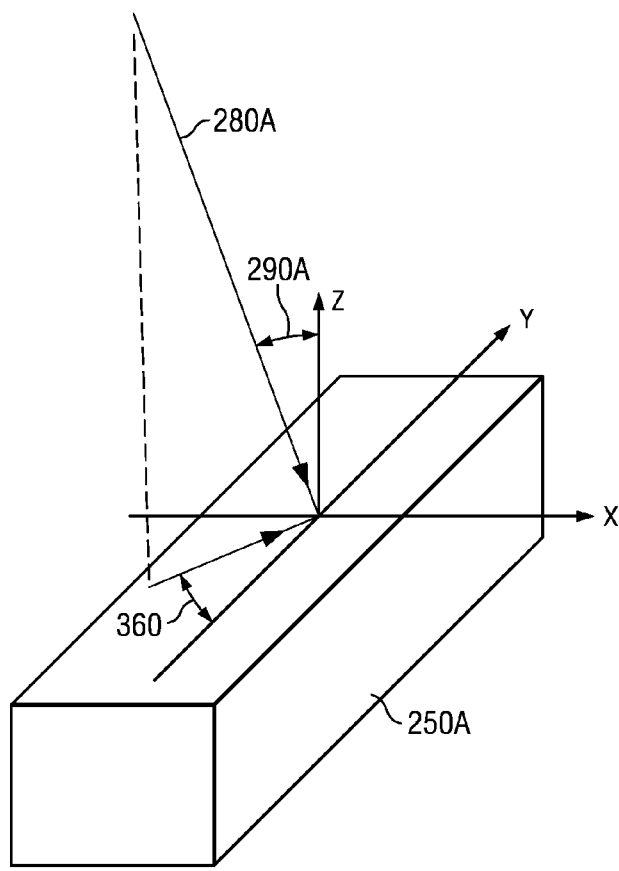
FIG. 3A is a simplified perspective view of a pattern on an EUV photo mask according to various aspects of the present disclosure.
Figure 3B:
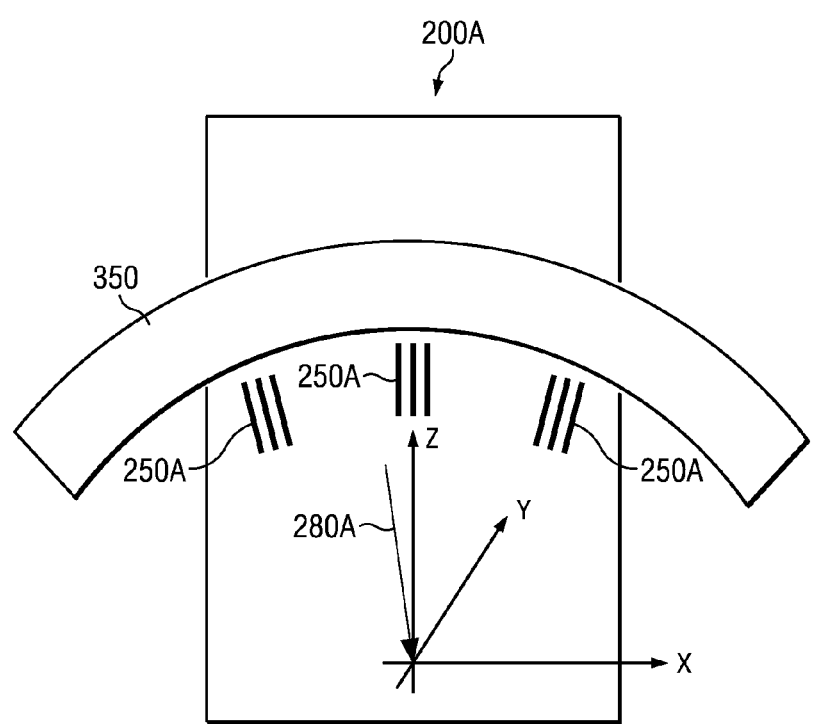
FIG. 3B is a simplified top view of a portion of an EUV photo mask with a plurality of patterns according to various aspects of the present disclosure.

Three axes X, Y, Z are shown in FIGS. 3A and 3B. These three axes X, Y, and Z are orthogonal to one another. The X and Y axes collectively define a horizontal plane, for example a plane of the surface of the photo mask 200A on which the EUV light is projected. In some embodiments, the Y axis is the scan axis, and the X axis is the slit axis. The slit axis mostly defines the direction of the slit or aperture of the projection optics. An example slit or aperture 350 of the EUV projection optics is shown in FIG. 3B. As is illustrated, the slit 350 has a shape of an arc (or a portion of a ring) in the present embodiment. It is understood that the slit 350 is not an actual feature formed on the photo mask 200A. FIG. 3B merely shows what a superposition of the slit 350 and the photo mask 200A would look like. The Z axis defines a vertical direction and represents the vertical axis 300 of FIG. 2. It is against the Z axis that the incident angle 290A is formed by the EUV light 280A. The projection of the light 280A onto the horizontal plane defined by the X and Y axes forms an azimuthal angle 360 with the Y axis.

The slit 350 is also correlated with the azimuthal angle 360. Depending on the location of a point on the slit 350, the azimuthal angle would be different. For example, in some embodiments, the end points of the slit 350 (end points of the arc) have corresponding angles of about 66 degrees and 114 degrees, respectively. That is, assuming the center of the slit is defined a 90 degrees, then the end points varies by −24 and 24 degrees, respectively, thereby arriving at 66 (66=90−24) degrees and 114 (114=90+24) degrees.

According to various aspects of the present disclosure, each pattern 250A points in a direction that is perpendicular to the arc of the slit 350. That is, each pattern 250A is substantially aligned with its corresponding azimuthal angle. Thus, the orientations of the patterns 250A are functions of their locations on the photo mask 200A. For example, as shown in FIG. 3B, the patterns 250A whose locations correspond to the center of the slit have azimuthal angles that are substantially equal to about 90 degrees. The patterns 250A whose locations correspond to the left of the center of the slit have azimuthal angles that are less than 90 degrees, for example about 66 degrees if the pattern's location corresponds to the left edge of the slit 350. The patterns 250A whose locations correspond to the right of the center of the slit have azimuthal angles that are greater than 90 degrees, for example about 114 degrees if the pattern's location corresponds to the right edge of the slit 350.

Figure 4:
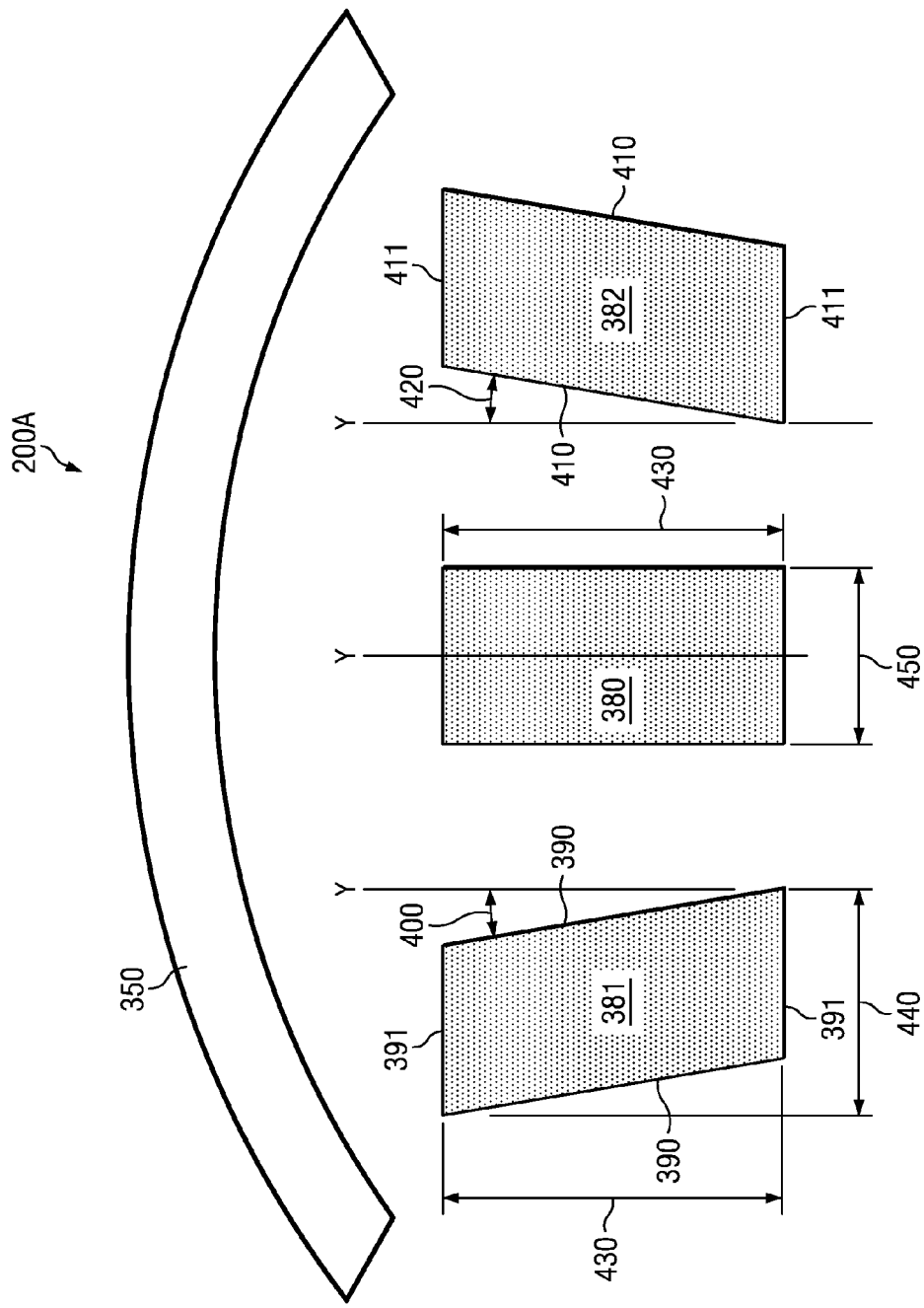
FIG. 4 is a simplified top view of a portion of an EUV photo mask with some of the patterns shown in greater detail according to various aspects of the present disclosure.

To illustrate the above concept in more detail, refer to FIG. 4, which is a simplified diagrammatic top view of a portion of the photo mask 200A. The slit 350 is also shown in FIG. 4 as being superimposed over the photo mask 200A. Three example patterns are illustrated as patterns 380, 381, and 382. Similar to the patterns 250 shown in FIGS. 2-3, the patterns 380-382 are elongate patterns and may be used to pattern semiconductor features such as gate lines on a wafer. The pattern 380 is located in a position that corresponds to the center of the slit 350, and therefore its associated azimuthal angle is 90 degrees. The pattern 380 is substantially aligned with the Y axis. The pattern 380 is shaped substantially as a rectangle.

The pattern 381 is located in a position that corresponds to a left of the center of the slit 350 (and thus to the left of the pattern 381). The pattern 381 is shaped substantially as a parallelogram. In other words, the pattern 381 has long sides 390 that are substantially parallel to each other, as well as short sides 391 that are substantially parallel to each other. The long side 390 forms an angle 400 with the Y axis. The azimuthal angle associated with the pattern 381 is (90−angle 400) degrees. For example, if the angle 400 is about 24 degrees, then the azimuthal angle associated with the pattern 381 is 66 degrees.

The pattern 382 is located in a position that corresponds to a right of the center of the slit 350 (and thus to the right of the pattern 380). The pattern 382 is shaped substantially as a parallelogram. In other words, the pattern 382 has long sides 410 that are substantially parallel to each other, as well as short sides 411 that are substantially parallel to each other. The long side 410 forms an angle 420 with the Y axis. The azimuthal angle associated with the pattern 382 is (90+angle 420) degrees. For example, if the angle 420 is about 24 degrees, then the azimuthal angle associated with the pattern 382 is 114 degrees.

Thus, it may be said that each of the patterns 380-382 is oriented according to its respective azimuthal angle. In other words, the long side (e.g., side 390 or 410) of each pattern 380-382 is substantially aligned with its azimuthal angle. Also, in an original design layout, the designer is constrained to design all the patterns to be oriented along the Y axis (e.g., such as the pattern 380). According to the various aspects of the present disclosure, such original design layout is transformed into the layout shown in FIG. 4, where the patterns not located at the center of the slit 350 are effectively "rotated" such that they are oriented according to their azimuthal angle. The parallelogram shape of the non-slit-center patterns 381 and 382 are also obtained as a result of the pattern transformation. The parallelogram-shaped patterns 381 and 382 have the same dimension 430 in the Y-direction as that of their original rectangular patterns in the design layout, but their dimension 440 in the X-direction is greater than that of their original rectangular patterns in the design layout. For example, if the pattern 381's original dimension in the X-direction is a dimension 450 (which is also the X-directional dimension of the pattern 380), then after the transformation, the new dimension in the X-direction for the pattern 381 is equal to: the dimension 450+the dimension 430*tan(ϕ), where ϕ is the azimuthal angle associated with the pattern 381. The new X-directional dimension for the pattern 382 can be calculated in a similar manner.

The shadow bias (due to the shadow effect) can be mathematically expressed with the following equation:

$$\text{Shadow bias} \sim -2*M*\tan(\theta)*\sin^2(\phi+\alpha-C)$$

where M is a magnification factor (magnification from photo mask to wafer), θ is an incident angle, ϕ is an azimuthal angle, α is a variable (where α is 0 for a vertical pattern oriented along the Y-axis, and where α is 90 for a horizontal pattern oriented along the X-axis), and C is a variable that represents the orientation of the pattern. Thus, to minimize the shadow bias, the above equation should be manipulated so that it yields zero. Specifically, the term $\sin^2(\phi+\alpha-C)$ should be set to 0. Since the design rules specify that all the patterns should be laid out in the vertical direction (aligned with the Y-direction) originally, α=0. Thus, C should be set to always be equal to the azimuthal angle ϕ for each pattern in order for the shadow bias to be substantially eliminated. Stated differently, the pattern after the transformation should be oriented in the same direction as the azimuthal angle associated with the pattern.

As discussed above, the patterns on the EUV photo mask can be transferred to a wafer. Thus, in some embodiments, the semiconductor features formed on the in the wafer may also have polygonal shapes such as the parallelograms illustrated in FIG. 4. Since the shadow bias is substantially eliminated, the resolution of the semiconductor features formed on the wafer can be significantly improved. In various embodiments, the semiconductor devices to be patterned on a wafer may include, but are not limited to, memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors.

Figure 5:
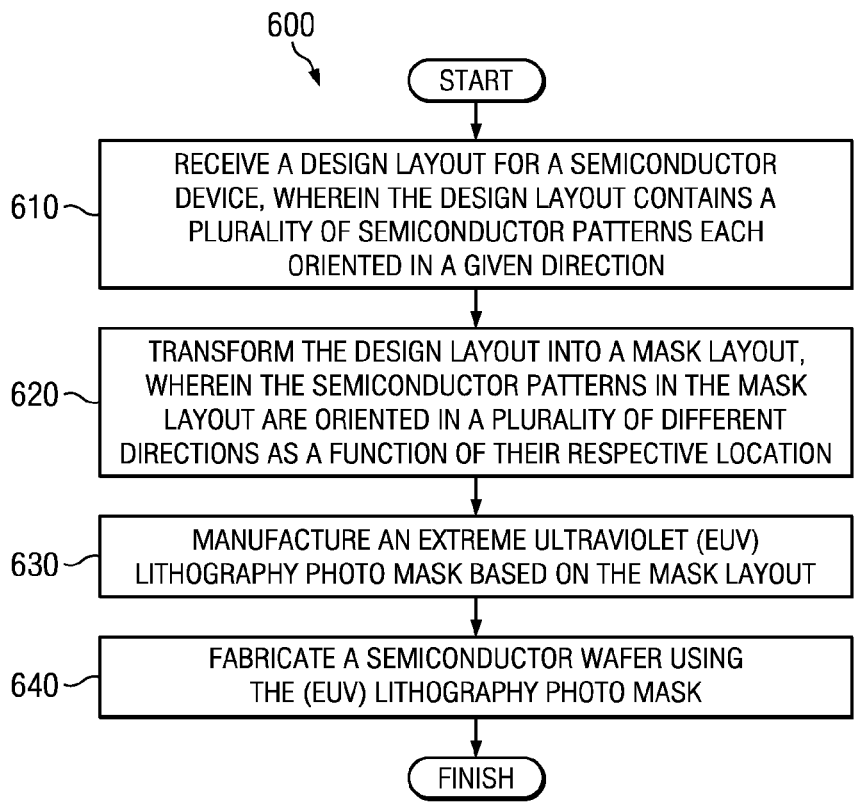
FIG. 5 is a flowchart illustrating a method of fabricating a semiconductor device according to various aspects of the present disclosure.

FIG. 5 is a flowchart of a method 600. The method 600 includes a block 610, in which a design layout for a semiconductor device is received. The design layout contains a plurality of semiconductor patterns each oriented in a given direction. In some embodiments, the design layout is received from a designer or a customer of a foundry. In certain embodiments, the given direction spans along a Y-axis, and wherein the Y-axis defines a scan axis for a lithography process. The directional constraint placed on the entity providing the design layout may come from a foundry. The patterns may define semiconductor features to be formed on a wafer. For example, the patterns may each define a gate line. The method 600 includes a block 620, in which the design layout is transformed into a mask layout. The semiconductor patterns in the mask layout are oriented in a plurality of different directions as a function of their respective location. In some embodiments, the semiconductor patterns in the mask layout are each oriented in accordance with their respective azimuthal angle. In some embodiments, at least a subset of the semiconductor patterns are each shaped as a parallelogram. The method 600 includes a block 630, in which an extreme ultraviolet (EUV) lithography photo mask is manufactured based on the mask layout. In some embodiments, the foundry receives the design layout from its customer, and after transforming the design layout into a mask layout, manufactures an EUV photo mask based on the mask layout. In some embodiments, the foundry may outsource the actual manufacturing of the EUV photo mask to another vendor. The method 600 includes a block 640, in which a semiconductor wafer is fabricated using the EUV lithography photo mask. It should be noted that additional processes may be provided before, during, and after the method blocks shown in FIG. 5, and that some other processes may only be briefly described herein.

Figure 6:
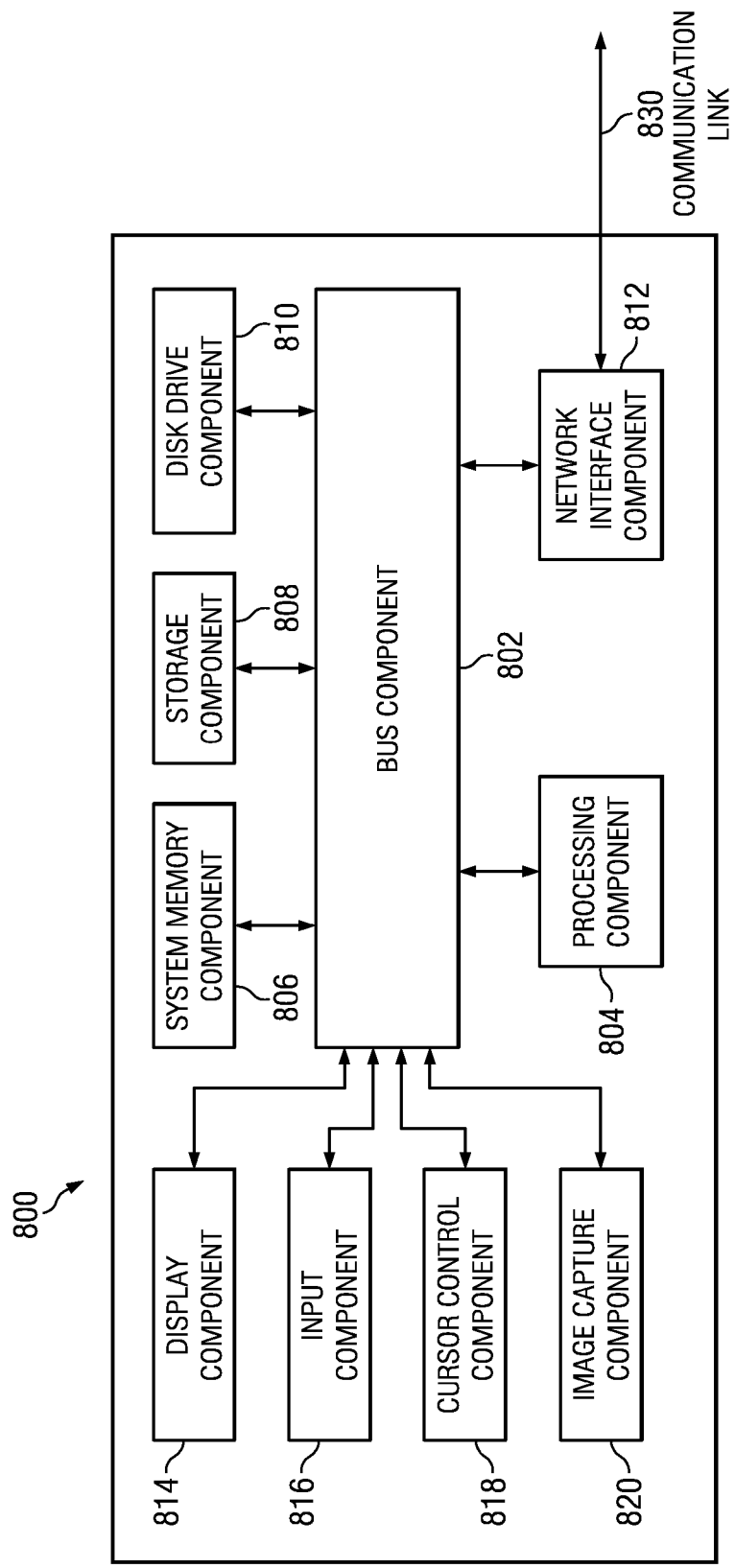
FIG. 6 is a computer system for performing some of the processes discussed above with reference to FIGS. 1-5 according to various aspects of the present disclosure.

FIG. 6 is a block diagram of a computer system 800 suitable for implementing various methods and devices described herein, for example, the various method blocks of the methods 400, 500, and 600 discussed above. For example, the computer system 800 is operable to transform the design layout into the mask layout. In various implementations, the devices of the computer system 800 may comprise a network communications device or a network computing device (e.g., mobile cellular phone, laptop, personal computer, network server etc.) capable of communicating with a network (e.g., an intranet or the Internet). It should be appreciated that each of the devices may be implemented as the computer system 800 for communication with the network in a manner as follows.

In accordance with various embodiments of the present disclosure, the computer system 800, such as a local computer or a networked computer system, includes a bus component 802 or other communication mechanisms for communicating information, which interconnects subsystems and components, such as processing component 804 (e.g., processor, micro-controller, digital signal processor (DSP), etc.), system memory component 806 (e.g., RAM), static storage component 808 (e.g., ROM), disk drive component 810 (e.g., magnetic or optical), network interface component 812 (e.g., modem or Ethernet card), display component 814 (e.g., cathode ray tube (CRT) or liquid crystal display (LCD)), input component 816 (e.g., keyboard), cursor control component 818 (e.g., mouse or trackball), and image capture component 820 (e.g., analog or digital camera). In one implementation, disk drive component 810 may comprise a database having one or more disk drive components.

In accordance with embodiments of the present disclosure, computer system 800 performs specific operations by processor 804 executing one or more sequences of one or more instructions contained in system memory component 806. Such instructions may be read into system memory component 806 from another computer readable medium, such as static storage component 808 or disk drive component 810. In other embodiments, hard-wired circuitry may be used in place of (or in combination with) software instructions to implement the present disclosure.

Logic may be encoded in a computer readable medium, which may refer to any medium that participates in providing instructions to processor 804 for execution. Such a medium may take many forms, including but not limited to, non-volatile media and volatile media. In one embodiment, the computer readable medium is non-transitory. In various implementations, non-volatile media includes optical or magnetic disks, such as disk drive component 810, and volatile media includes dynamic memory, such as system memory component 806. In one aspect, data and information related to execution instructions may be transmitted to computer system 800 via a transmission media, such as in the form of acoustic or light waves, including those generated during radio wave and infrared data communications. In various implementations, transmission media may include coaxial cables, copper wire, and fiber optics, including wires that comprise bus 802.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice the present disclosure may be performed by computer system 800. In various other embodiments of the present disclosure, a plurality of computer systems 800 coupled by communication link 830 (e.g., a communications network, such as a LAN, WLAN, PTSN, and/or various other wired or wireless networks, including telecommunications, mobile, and cellular phone networks) may perform instruction sequences to practice the present disclosure in coordination with one another.

Computer system 800 may transmit and receive messages, data, information and instructions, including one or more programs (i.e., application code) through communication link 830 and communication interface 812. Received program code may be executed by processor 804 as received and/or stored in disk drive component 810 or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as computer program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The embodiments disclosed herein offer advantages over existing lithography processes. It is understood, however, that other embodiments may offer additional advantages, and that no particular advantage is required for all embodiments, and some advantages may only be briefly discussed herein. One advantage is that the shadow bias or shadow effect associated with existing EUV lithography processes can be substantially eliminated. In various embodiments, the elimination of the shadow effect is achieved through orienting the patterns on a photo mask such that they are aligned as a function of their respective azimuthal angles. Another advantage is that the customer of a foundry need not make many adjustments to its own design layout. The only design rule that the customer needs to follow is that the device patterns in the design layout need to be oriented in the same direction, for example a Y-direction (scan axis) direction. The pattern orientation transformation can be performed by the foundry without the involvement or supervision of the customer (designer), thereby lessening the burden for the designer.

One of the broader forms of the present disclosure involves a semiconductor fabrication apparatus. The semiconductor fabrication apparatus includes: a lithography mask having a plurality of patterns, wherein at least two of the plurality of patterns are oriented in different directions, and wherein orientations of the at least two patterns are a function of their locations over the mask.

In some embodiments, the mask is an extreme ultraviolet (EUV) lithography mask.

In some embodiments, the mask includes a plurality of alternating Silicon-Molybdenum layers.

In some embodiments, the orientation of each pattern is substantially aligned with its corresponding azimuthal angle.

In some embodiments, at least a subset of the patterns are shaped substantially as parallelograms.

In some embodiments, each pattern defines a gate line for a semiconductor transistor.

In some embodiments, the semiconductor fabrication apparatus further includes: a projection optics tool that is operable to transfer the patterns of the mask onto a semiconductor wafer, wherein the projection optics tool contains a ring-like slit from which light passes through.

Another of the broader forms of the present disclosure involves a semiconductor lithography system. The semiconductor lithography system includes: a projection optics component, wherein the projection optics component includes a curved aperture; and a photo mask positioned over the projection optics component, wherein the photo mask contains a plurality of elongate semiconductor patterns, wherein the semiconductor patterns each point in a direction substantially perpendicular to the curved aperture of the projection optics component.

In some embodiments, the semiconductor lithography system is an extreme ultraviolet (EUV) lithography system; and the photo mask includes multiple reflective layers.

In some embodiments, the semiconductor patterns each have an associated azimuthal angle based on their respective locations relative to the curved aperture; and the semiconductor patterns are each shaped as a function of their respective azimuthal angle.

In some embodiments, the semiconductor patterns are each oriented according to their respective azimuthal angles.

In some embodiments, at least some of the semiconductor patterns are polygons containing no right angles.

In some embodiments, the aperture is shaped as an arc from a top view.

In some embodiments, at least a subset of the semiconductor patterns each define a gate line for a semiconductor transistor device.

Still another of the broader forms of the present disclosure involves a method. The method includes: receiving a design layout for a semiconductor device, wherein the design layout contains a plurality of semiconductor patterns each oriented in a given direction; and transforming the design layout into a mask layout, wherein the semiconductor patterns in the mask layout are oriented in a plurality of different directions as a function of their respective location.

In some embodiments, the semiconductor patterns in the mask layout are each oriented in accordance with their respective azimuthal angle.

In some embodiments, at least a subset of the semiconductor patterns in the mask layout are each shaped as a parallelogram.

In some embodiments, the given direction spans along a Y-axis, and wherein the Y-axis defines a scan axis for a lithography process.

In some embodiments, the method further includes manufacturing an extreme ultraviolet (EUV) lithography photo mask based on the mask layout.

In some embodiments, the method further includes fabricating a semiconductor wafer using the (EUV) lithography photo mask.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photo mask, comprising:
   a first layout pattern disposed in a first location on the photo mask, wherein the first layout pattern points to a first direction that is correlated with a first azimuthal angle; and
   a second layout pattern disposed in a second location on the photo mask, wherein the second layout pattern points to a second direction that is correlated with a second azimuthal angle.

2. The photo mask of claim 1, wherein:
   the first azimuthal angle is an azimuthal angle of the first layout pattern; and
   the second azimuthal angle is an azimuthal angle of the second layout pattern.

3. The photo mask of claim 1, wherein the mask is an extreme ultraviolet (EUV) lithography mask.

4. The photo mask of claim 1, wherein:
   the first layout pattern defines a top view pattern of a first feature of a semiconductor device;
   the second layout pattern defines a top view pattern of a second feature of the semiconductor device; and
   the first feature and the second feature are a same type of semiconductor feature.

5. The photo mask of claim 4, wherein the first feature and the second feature are gate lines of the semiconductor device.

6. The photo mask of claim 4, wherein the first layout pattern and the second layout pattern have different top view profiles.

7. The photo mask of claim 6, wherein:
   the first layout pattern has a top view profile resembling a parallelogram; and
   the second layout pattern has a top view profile resembling a rectangle.

8. A semiconductor lithography system, comprising:
   a projection optics tool configured to transfer layout patterns of a photo mask onto a semiconductor wafer, wherein the projection optics tool includes a curved slit from which light passes through; and
   the photo mask, wherein the photo mask contains at least a first layout pattern and a second layout pattern, and wherein the first and second layout patterns are oriented in a first and a second direction, respectively, based on their locations on the photo mask relative to the curved slit of the projection optics tool.

9. The semiconductor lithography system of claim 8, wherein the semiconductor lithography system is an extreme ultraviolet (EUV) lithography system, and wherein the photo mask is an EUV photo mask.

10. The semiconductor lithography system of claim 8, wherein:
   the first layout pattern has a first azimuthal angle based on the location of the first layout pattern;
   the second layout pattern has a second azimuthal angle based on the location of the second layout pattern, the second azimuthal angle being different from the first azimuthal angle;
   the first direction is correlated with the first azimuthal angle; and
   the second direction is correlated with the second azimuthal angle.

11. The semiconductor lithography system of claim 8, wherein:
   the first layout pattern corresponds to a first semiconductor feature; and the second layout pattern corresponds to a second semiconductor feature that is the same type of semiconductor feature as the first semiconductor feature.

12. The semiconductor lithography system of claim 11, wherein the first layout pattern and the second layout pattern each correspond to a semiconductor gate line.

13. The semiconductor lithography system of claim 12, wherein the first layout pattern and the second layout pattern have different top view shapes.

14. The semiconductor lithography system of claim 13, wherein:
   the first layout pattern has a parallelogram-like top view shape; and
   the second layout pattern has a rectangular top view shape.

15. A method, comprising:
   generating a mask layout of a semiconductor device based on a design layout of the semiconductor device, wherein the generating comprises adjusting orientations of one or more semiconductor layout patterns of the design layout such that the adjusted one or more semiconductor layout patterns point to new directions in the mask layout.

16. The method of claim 15, wherein the adjusting of the orientations of the one or more semiconductor layout patterns is performed based on respective locations of the one or more semiconductor layout patterns.

17. The method of claim 15, wherein the adjusting of the orientations of the one or more semiconductor layout patterns is performed based on respective azimuthal angles of the one or more semiconductor layout patterns.

18. The method of claim 15, wherein the adjusting comprises changing at least one of the one or more semiconductor layout patterns from a rectangular pattern to a parallelogram-like pattern.

19. The method of claim 15, wherein the one or more semiconductor patterns define gate lines of a semiconductor device.

20. The method of claim 15, wherein the mask layout is used for generating an extreme ultraviolet (EUV) lithography photo mask.

* * * * *